United States Patent [19]
Kunz et al.

[11] Patent Number: 4,751,480
[45] Date of Patent: Jun. 14, 1988

[54] ONE PORT MAGNETOSTATIC WAVE RESONATOR

[75] Inventors: William E. Kunz, Foster City; Kok W. Chang, Sunnyvale; Waguih S. Ishak, Cupertino, all of Calif.

[73] Assignee: Hewlett-Packard Company, Palo Alto, Calif.

[21] Appl. No.: 931,276

[22] Filed: Nov. 14, 1986

[51] Int. Cl.$^4$ .......................... H01P 7/00; H03B 7/12
[52] U.S. Cl. .................................. 333/219; 333/217; 333/235; 331/96; 331/132
[58] Field of Search ...................... 333/148, 24.1, 24.2, 333/202, 205, 213–217, 219, 235, 203, 204, 206, 207; 331/96, 117 D, 9, 107 R, 107 D, 107 SL, 132

[56] References Cited

U.S. PATENT DOCUMENTS

| | | | |
|---|---|---|---|
| 4,028,639 | 6/1977 | Hagon et al. | 331/96 |
| 4,528,529 | 7/1985 | Huijer | 333/235 X |
| 4,626,800 | 12/1986 | Murakami et al. | 331/96 |

OTHER PUBLICATIONS

"Webster's New Collegiate Dictionary", C&G Merriam Co. Publishers, Springfield, Mass., U.S.A., ©1961, p. 794.
Patent Abstracts, Yig Thin-Film Tuned MIC Oscillator, U.S. Pat. No. 4,626,800, IEEE Trans. on Microwave Theory and Techniques, vol. MTT-35, Nov. 1987; p. 1077.
Basawapatna et al-"A Unified Approach to the Design of Wide-Band Microwave Solid-State Oscillators", IEEE Trans. on Microwave Theory and Techniques, vol. MTT-27, No. 5, May 1979; pp. 379-385.

*Primary Examiner*—Marvin L. Nussbaum
*Attorney, Agent, or Firm*—John A. Frazzini

[57] ABSTRACT

An overcoupled resonator having a resonant cavity defined by a thin film of magnetic material with a pair of end walls parallel to a transducer. Because this resonator is overcoupled, it is suitable for use in a broadband oscillator.

18 Claims, 5 Drawing Sheets

ONE PORT MAGNETOSTATIC WAVE RESONATOR

BACKGROUND OF THE INVENTION

This invention relates in general to resonators and relates more particularly to thin film YIG resonators. Yittrium Iron Garnet (YIG) spheres are used as resonator elements in many microwave components and in particular are used in tunable oscillators. The solid state active devices used in these units are typically mounted on a suitable transmission medium and the YIG spheres are mounted on a separate support rod. Energy is exchanged between the active device and the YIG sphere via a coupling loop that is electrically connected to the active device and that is magnetically coupled to the YIG sphere.

Unfortunately, there are several disadvantages to this type of resonator. Because the YIG sphere and the active device are not mounted on the same support surface, this device can exhibit significant temperature dependent behavior. The YIG sphere resonator cannot be manufactured by the photolithographic technology typically used to manufacture the active circuit so that the cost associated with circuits utilizing YIG spheres is increased. The sphere to loop alignment and the loop to transmission medium attachment are critical parameters that further increase fabrication expense and lead to variable resonator quality. The YIG sphere utilizes a resonant mode in which the magnetic dipoles in the sphere precess around a common axis that is oriented along the direction of an applied bias magnetic field. Ideal operation of the YIG shperes require that the spheres be perfectly elliptical. Any asymmetry in the sphere, coupling loop or bias field will result in spin wave interference with the uniform procession mode, thereby degrading the performance of the YIG sphere resonator.

Several forms of magnetostatic wave (MSW) resonators are also known. These tunable resonators can be used as the frequency selective elements in tunable oscillator circuits in the 0.5-26 GHz frequency range. The planar structure of the resonators makes integration with other integrated circuits easy and attractive. Moreover, because the velocity of propagation of magnetostatic waves in YIG films is only two order of magnitudes lower than the velocity of light, the linewidths involved in fabricating magnetostatic wave (MSW) resonators are of the order of 10-100 microns, allowing easy photolithographic processing.

The first MSW resonator reported in the literature (J. H. Collins, J. D. Adam and Z. M. Bardai, "One-port magnetostatic wave resonator", Proc. IEEE, July 1977, pp. 1090-1092) utilizes a 9 micron YIG film that is etched to form an array of parallel equispaced grooves that are 30 microns wide, 4000 microns long 1 micron deep and spaced by 120 microns. A microstrip transducer is formed over the region of the YIG film containing the grooves. These grooves each reflect some of the magnetostatic waves generated by the transducer and have a resonant response when the wavelength of these waves equals the spacing of the etched grooves. Unfortunately, it is difficult to etch accurate grooves in the YIG film. In addition, these etched grooves exhibit a high amount of loss.

A two port resonator has also been produced (see W. R. Brinlee, J. S. Owens, C. V. Smith, Jr. and R. L. Carter, "Two-port magnetostatic wave resonators utilizing periodic metal reflective arrays", J. Appl. Phys., Vol. 52, Noi. 3, March 1981, pp. 2276-2278) that utilizes a metal reflective array on the surface of the YIG film instead of an array of etched grooves. Because of excessive eddy current losses in these metal arrays, the insertion loss of these resonators is more than 30 dB and the loaded Q is about 600.

In U.S. Pat. No. 4,528,529 entitled "Magnetostatic Wave Resonator" by Ernst Huijer is presented a resonator that has a block of YIG film that has two sides that are both substantially parallel to a microstrip transducer or to a pair of parallel microstrip transducers.

SUMMARY OF THE INVENTION

Figure 1:
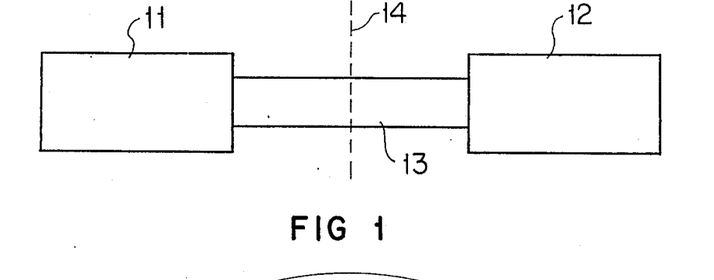
FIG. 1 is a block diagram of an oscillator.

In accordance with the illustrated preferred embodiment, a magnetostatic wave (MSW) resonator is presented that is particularly suitable for use in an oscillator. In FIG. 1 is presented an oscillator consisting of a negative resistance device 11 (i.e., an active device that exhibits gain) coupled to a resonator 12 by an electrical connector such as transmission line 13. Such circuits are most conveniently analyzed in terms of scattering parameters (S-parameters) as discussed in the article entitled "S-Parameter Techniques for Faster, More Accurate Network Design" in the Hewlett-Packard Journal, Volume 18, No. 6, February 1967.

The S-parameter $S'_{11}$ represents the complex output reflection coefficient of negative resistance device 11 that has its input terminated by a device having a complex reflection coefficient $G_2$. Oscillation occurs when the reflection coefficient $G_1$ presented to the output port of negative resistance device 11 is equal to $1/S'_{11}$.

Physically, the condition $S'_{11}*G_1=1$ for oscillation can be understood as follows. Transmission line 14 is conceptually divided at dashed line 14. When a wave having complex amplitude A is incident at line 14 from the left, it travels to resonator 12 and results in a travelling wave of complex amplitude A' incident at line 14 from the right. The ratio A'/A is defined to be the reflection coefficient $G_1$ for the resonator measured at location 14 in the transmission line. Thus, this reflected wave has amplitude $A'=A*G_1$.

This travelling wave from the right then interacts with the active device to produce a travelling wave of complex amplitude A" that is incident on line 14 from the left. The ratio A"/A' is equal to the reflection coefficient $S'_{11}$ of negative resistance device 11. Thus, $A''=A*G_1*S'_{11}$ so that the effect of a round trip of a travelling wave (i.e., from line 14 to resonator 12, then to negative impedance device 11 and back to line 14) is to multiply the complex phase of the wave by $G_1*S'_{11}$.

For stable oscillation, this round trip of the signal should have an unchanged amplitude so that the signal does not grow or decay exponentially and should have a phase shift of some integer times 2*pi so that there is constructive interference in the resonator. In actuality, if $G_1*S'_{11}$ is a positive real number greater than 1, then the system will oscillate with an exponentially growing amplitude. As the magnitude M (where M is the absolute value of the complex amplitude A) increases, the gain of negative resistance device 11 begins to saturate so that the magnitude of the gain decreases until the product $G_1*S'_{11}$ is equal to 1.

Figure 2:
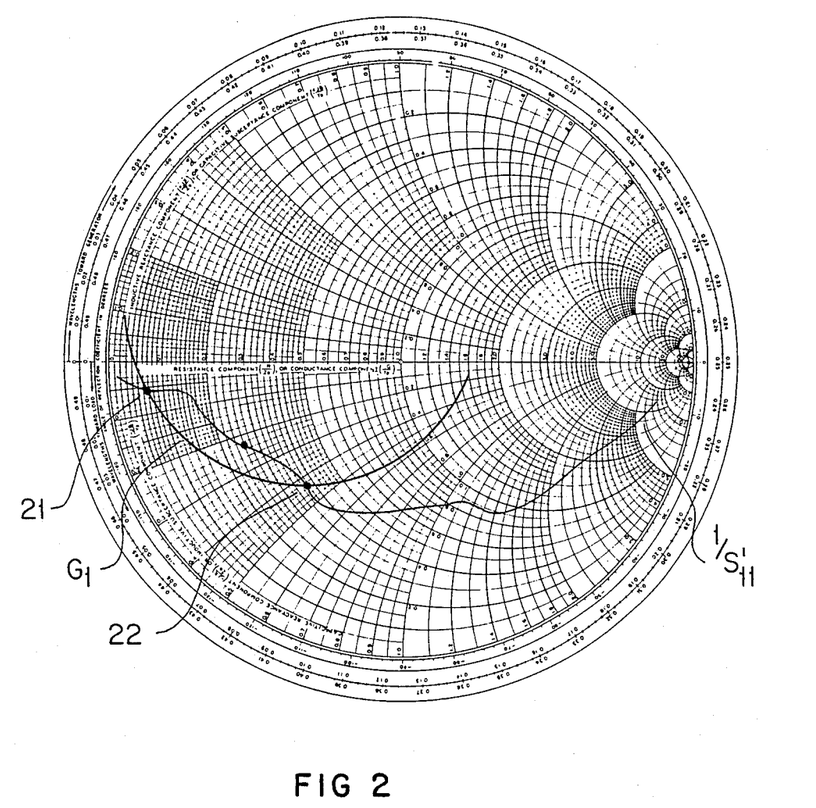
FIG. 2 illustrates how a Smith Chart plot can be used to determine at which frequencies an oscillator will oscillate.

The frequency response of the oscillator shown in FIG. 1 can be analyed by plotting $G_1$ and $1/S'_{11}$ on a Smith chart as a function of frequency. Such a plot is illustrated in FIG. 2. The magnitude and phase of a point of $G_1$ or $1/S'_{11}$ are indicated by the radial and angular coordinates of that point. In the range from point 21 to point 22 over which the magnitude of $G_1*S'_{11}$ is greater than 1, the frequency for $1/S'_{11}$ varies from a first frequency $f'_1$ to a second frequency $f'_2$. Over this same range from point 21 to point 22, the frequency for $G_1$ varies from a third frequency $f'_3$ to a fourth frequency $f'_4$. Resonances will not result outside of this range because the magnitude of the product of $G_1*S'_{11}$ is less than 1. Resonances will result within this range only at those frequencies for which $G_1$ and $1/S'_{11}$ have the same phase.

These resonant components begin growing exponentially, but, as negative resistance device 11 begins to saturate, the plot of $1/S'_{11}$ begins to move out toward the boundary of the Smith Chart until the magnitude of $G_1*S11$ is less than 1 at all frequencies except one at which the phase of $G_1*S'_{11}$ is zero. The circuit then oscillates with constant magnitude at this frequency.

Figure 3:
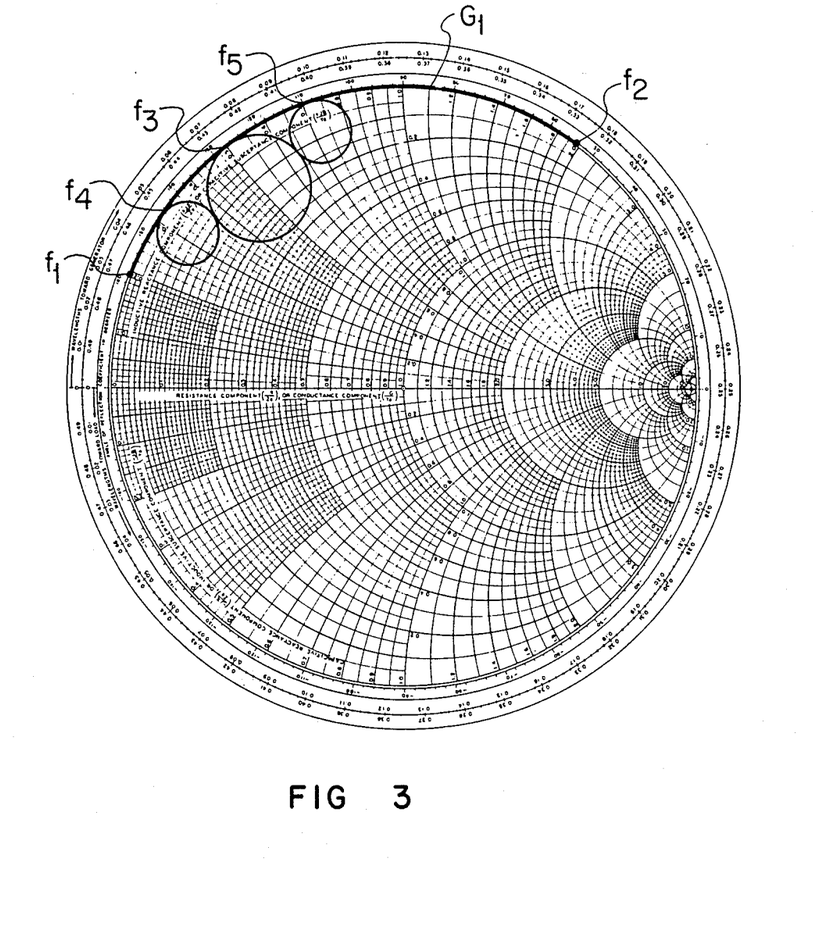
FIG. 3 illustrates the reflection coefficient $G_1$ of a resonator having a primary resonance and a pair of secondary resonances.

In the article by Ganesh R. Basawapatna and Roger B. Stancliff entitled "A Unified Approach to the Design of Wide-Band Microwave Solid-State Oscillators" published in Transactions On Microwave Theory and Techniques, Vol. MTT-27, No. 5, May 1979, the design theory of such oscillators is discussed. As is illustrated by two negative resistance devices discussed in that article, $1/S'_{11}$ typically lies in the capacitive portion (i.e., in the lower half) of the Smith Chart, as is the case in FIGS. 2 and 3.

The frequency dependence of $G_1$ results from: (a) the phase variation introduce by transmission line 13 and by the transducer in resonator 12; and (b) the resonant behavior of resonator 12. At frequencies at which the wavelength is comparable or smaller than the lengths of this transducer and transmission line, these elements will produce at point 14 a phase variation with frequency equal to 2*pi times the change in the number of wavelengths of the signal within these conductors.

As the frequency is varied, the number of wavelengths of the travelling wave in the transmission line and in the resonator transducers also varies, thereby introducing a phase change into $G_1$ as a function of frequency.

In those frequency ranges away from a resonance, the resonator absorbs very little energy from a wave so that the variation of $G_1$ with frequency f is determined primarily by the phase change introduced by the conductors. Therefore, in such frequency ranges, $G_1$ varies along a curve located at the perimeter of the Smith Chart. At a resonance of the resonator there is a rapid change in phase as a function of frequency. In addition to this phase change, at the resonance, the resonator absorbs some of the incident wave so that curve $G_1$ moves inward from the perimeter of the Smith Chart. Thus, near a resonance (e.g., the primary resonance at frequency $f_3$ in FIG. 3), the magnitude of $G_1$ becomes less than 1 so $G_1$ varies along a circular curve that extends into the Smith Chart (see, for example, Hewlett-Packard Application Note 154 entitled "S-Parameter Design", April 1972, pages 7-8). The resonator will typically exhibit secondary resonances as shown at frequencies $f_4$ and $f_5$. The points of closest approach of this curve to the center of the Smith Chart represent the points of greatest absorption and therefore correspond to the resonant frequencies.

In accordance with the preferred embodiments presented below, the resonator contains a slab of magnetic material having a pair of end walls that are parallel to an input/output transducer. The distance between the end walls and the magnitude of an applied bias magnetic field determine the frequency at which the primary resonance occurs. As the coupling between the transducer and the slab is increased (e.g., by bringing the slab closer to the transducer and/or by orienting the slab to increase the magnetic coupling between the slab and the transducer), the amount of energy absorbed by the resonator at resonance increases. When the input impedance of the resonator at its primary resonance (at $f_3$) is equal to the characteristic impedance of the transmission line, then all of the energy incident on the resonator will be absorbed. Thus, $G_1$ will pass through the origin of the Smith Chart under such conditions. When this happens for the primary resonance, it is referred to as "critical coupling" between the magnetic slab and the transducer. When the coupling is weaker than this (equivalently, when the primary resonance does not pass through or encircle the center of the Smith Chart), the resonator is referred to as being "undercoupled". When the coupling is stronger than critical coupling (equivalently, when the primary resonance encircles the center of the Smith Chart), the resonator is referred to as being "overcoupled".

Figure 4A:
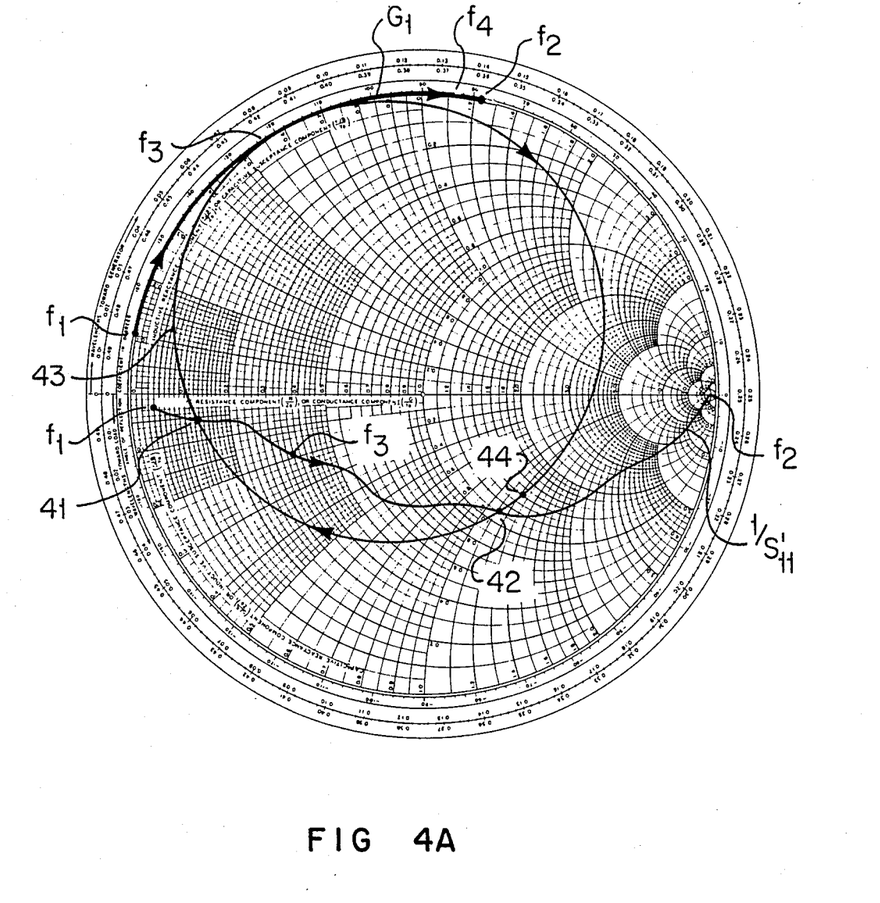
FIG. 4A and 4B are Smith Chart plots that illustrate how an overcoupled resonator can be used with a negative resistance device to produce tunable broadband oscillation.
Figure 4B:
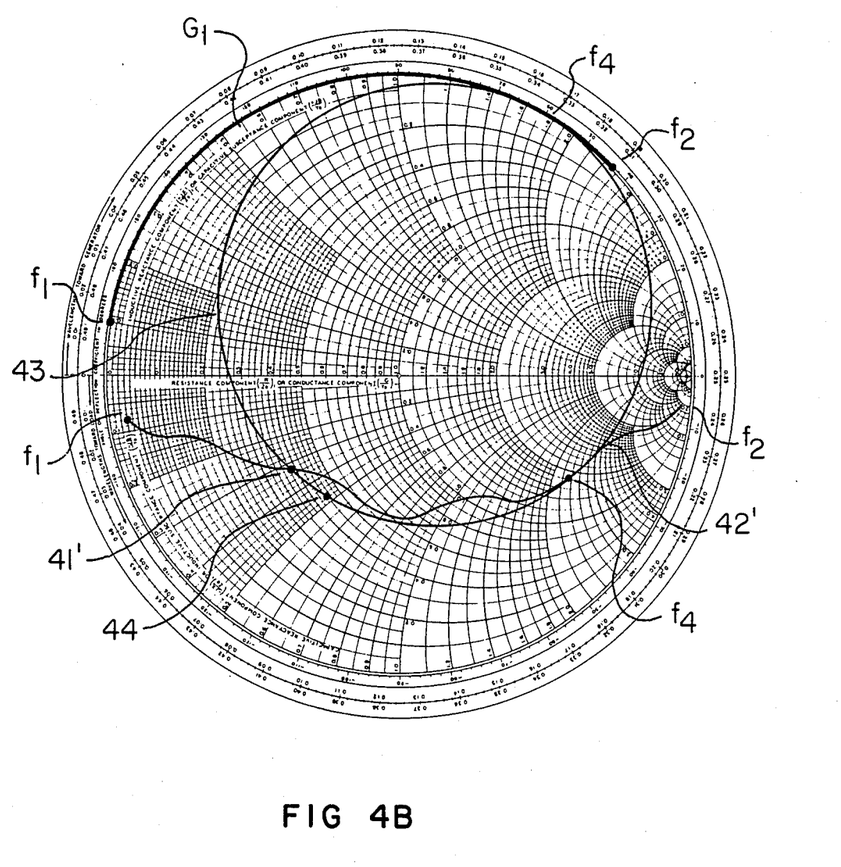

In accordance with the disclosed embodiments, the geometry of the resonator is selected so that the resonator is overcoupled as illustrated in FIGS. 4A and 4B. In general, curve $1/S'_{11}$ has increasing frequency from a first frequency $f'_1$ at point 41 to a second frequency $f'_2$ at point 42 at which the curves $G_1$ and $1/S'_{11}$ intersect. Likewise, curve $G_1$ increases in frequency from frequency $f_1$ to $f_2$. The arrowheads on these curves indicate the direction of increasing frequency. Thus, between points 41 and 42, curves $G_1$ and $1/S'_{11}$ have increasing frequency in opposite directions of phase variation. Thus, if and only if $f_3$ lies in the range between $f'_1$ and $f'_2$, there will be a phase of the Smith Chart at which both G1 and $1/S'_{11}$ have the same phase at the same frequency. The oscillator will oscillate at the frequency of that point.

There is an additional benefit to curves $G_1$ and $1/S'_{11}$ increasing in frequency in opposite directions of phase variation. If they increased in the same direction, then there could be a range of frequencies where $G_1$ and $1/Si'_{11}$ have substantially the same phase. In such a situation, the oscillator frequency will not be sharply defined and this will result in an unstable oscillation condition.

Because, for a narrow resonance, the variation of frequency will be small across the resonance, oscillation will occur substantially at $f_3$. The actual oscillation can be on either the low or high frequency side of the resonance peak. In FIG. 4A, the resonance peak occurs at point 44 which is at the point of closest approach of the resonance circle 43 to the center of the Smith Chart. Since, in this case, point 43 does not lie between points 41 and 42 of intersection of the curves, the point of oscillation must occur on the high frequency side of the resonance peak.

The resonators utilized in the preferred embodiments have a tunable resonance frequency $f_3$. In FIG. 4A, $f_1$ and $f_2$ represent the lower and upper limits of the frequency range of the oscillator. As $f_3$ is increased to a frequency $f_4$, resonance circle 43 will move to be tangent to the perimeter of the Smith Chart at that frequency. This condition is represented in FIG. 4B. Curve $G_1$ now has greater magnitude than curve $1/S'_{11}$ from a frequency $f_1$ at point 41' to a frequency $f'_2$ at point 42'. If and only if $f_4$ lies between $f'_1$ and $f'_2$ will there be an oscillation at substantially $f_4$. Thus, to have a broad band oscillator that can be tuned to oscillate over a range from $f_1$ to $f_2$, then negative resistance device 12 must exhibit gain across that entire band. In addition, there must be sufficient overcoupling that, at each frequency f within that range, resonance circle 43 has a segment that has a greater magnitude than $1/S'_{11}$ over some range of frequencies for $1/S'_{11}$ that includes f. FIG. 4B also indicates that the oscillation frequency will be at a point on the low frequency side of the resonance peak.

The resonator has one end of its transducer shorted at the frequencies of interest so that point $f_1$ occurs in the inductive (upper) half of the Smith Chart. The combined electrical length of the resonator transducer and the part of the transmission line between line 14 and resonator 12 is selected to be less than $\frac{1}{4}$ of the wavelength in these conductors at frequency $f_2$. Since the width W of the magnetic slab is substantially equal to the length of the transducer, this also sets an upper limit on the width of the magnetic slab. These choices are made so that curve $G_1$ extends into the lower half plane of the Smith Chart only at the primary resonance. This is done so that oscillation will only occur at a frequency substantially equal to the primary resonance frequency. Since the frequency of this resonance is tunable by varying the magnitude of a bias magnetic field applied to the magnetic slab, the oscillator frequency is thereby tunable in the same manner.

In general, a resonator will have a fundamental resonance with some much smaller secondary resonances. For example, in a rectangular cavity, the primary resonance typically is produced for a wave that travels back and forth between two perpendicular ends of the cavity that are spaced such that there is an integral number of periods of the wave in the roundtrip path between these two parallel sides of the cavity. Secondary resonances can result for waves in other directions (e.g., in a direction perpendicular to two other parallel sides of the cavity) or with a different number of periods of the wave in a roundtrip between the first pair of parallel sides.

These other resonances result in spurious oscillations of the oscillator. In order to suppress these spurious oscillations, it is important that $G_1*S'_{11}$ does not have a real value greater than one for any of these secondary resonances. In accordance with the disclosed preferred embodiments of the invention, the dimension and geometry of the magnetic slab are chosen to suppress the secondary resonances.

The distance L between end walls s1 and s2 (i.e., the length L of the YIG slab) is chosen smaller than the width W of the slab to suppress resonance modes between side walls of the slab. The primary resonance occurs for a travelling wave having one period in a round trip between end walls s1 and s2. For a rectangular slab, the length L of the slab (i.e., the distance between the two end walls) is selected to be at most one-fourth W in order to suppress high order resonant modes between the side walls and between the end walls. In addition, the sidewalls are preferably chosen to be non-parallel further to suppress these secondary modes.

DESCRIPTION OF THE PREFERRED EMBODIMENT

Figure 5:
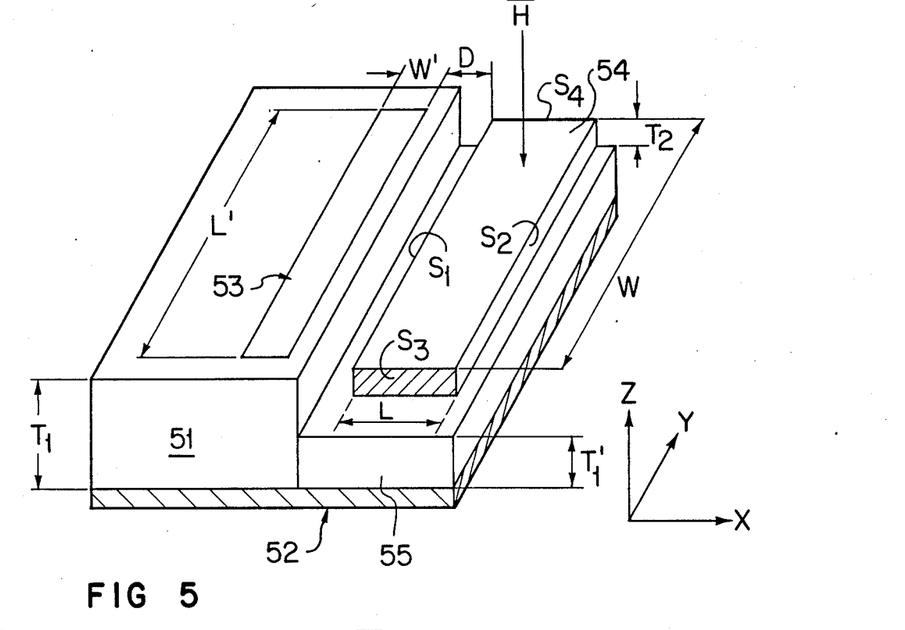
FIG. 5 illustrates a side coupled embodiment of the overcoupled resonator.

FIG. 5 shows a side coupled overcoupled resonator. On one side of a dielectric substrate 51, such as sapphire or quartz, is a conductive ground plane 52 formed, for example from a layer of gold plated aluminum. On the other side of the dielectric substrate is a transducer such as microstrip 53. Substrate 51 typically has a thickness $T_1$ on the order of 250 microns. A second substrate 55 of thickness $T_1$ on the order of 100-150 microns is located adjacent to dielectric substrate 51. On this portion of reduced thickness is mounted a slab of magnetic material such YIG film 54. The thickness $T_2$ of YIG film 54 is typically on the order of 50-100 microns.

A bias field H is applied to the magnetic material to align the magnetic dipoles in YIG film 54. This applied field is varied to change the phase velocity of waves in the film in order to vary the frequency at which the resonator resonates. The direction of the applied film determines whether the waves in the film are magnetostatic surface waves (MSSW), magnetostatic forward volume waves (MSFVW) or magnetostatic backward volume waves (MSBVW). In this particular embodiment, the bias film is in the z direction, perpendicular to the surface of film 54, so that this device operates in MSFVW mode.

Currents in microstrip 53 generate magnetic fields that induce travelling waves between end walls $s_1$ and $s_2$. These end walls and the side walls $s_3$ and $s_4$ form a cavity within which resonant modes can be produced. Microstrip 53 and end walls $s_1$ and $s_2$ are selected to be parallel so that the microstrip launches travelling waves in a direction perpendicular to these end walls. A resonance occurs when there are an integral number n of waves contained in a roundtrip of a travelling wave between these end walls.

The resonant modes of the cavity will also have an integral number m of wavelengths in a roundtrip between side walls $s_3$ and $s_4$. Typically, the mode $(n,m)=(1,1)$ will be used as the primary resonance of the cavity. The choice of parameters, including the choice of the direction of the bias field, is made so that this mode is the lowest frequency mode of the cavity. Dimensions of microstrip 53 and the cavity are chosen to suppress the other (secondary) resonances of the cavity. In particular, the width W of YIG film 54 is typically selected to be much larger than the length L of the YIG film (i.e., w is on the order of or greater than 4 times L).

As discussed in the Summary of the Invention, the length L' of microstrip 53 plus the length of a conductor from this microstrip to negative resistance device 11 is selected to be less than $\frac{1}{4}$ the wavelength of this circuit at the highest frequency of operation. Typically, L' is chosen to be less than ⅛ of this electrical wavelength (i.e., the wavelength in the microstrip). When used in an oscillator, one end of microstrip 53 is connected to a negative resistance device 11 (as shown in FIG. 1) and the other end is shorted at the frequencies of operation. Typically, this second end is shorted by use of a capacitor that allows a low frequency bias field to be applied, but acts as a short to ground within the frequencies of operation of the oscillator. This is done to make the reflection coefficient $G_1$ of this resonator be in the inductive half of the Smith Chart.

At a short in a conductor, the current is at a maximum. Because microstrip 53 is shorted at one end and because L' is much less than one wavelength, the current magnitude is substantially constant as a function of position along the length of the microstrip. This reduces the coupling of these currents to higher order modes between the sides of the cavity, thereby helping to suppress these modes.

L' is also typically substantially equal to the width W of the YIG slab in order to maximize coupling between the microstrip and YIG film without introducing extra microstrip length that will add to the phase variation of $G_1$ as a function of frequency. Thus, W is also on the order of 1/10 of the smallest electrical wavelength in the range of operation. The length L of YIG film 54, however, is equal to ½ of the magnetostatic wavelength in the YIG cavity in order to have a resonance for the (1,1) mode. It should be noted that wave propagation velocities in the microstrip and the YIG cavity are not equal so that, for the same frequency, their wavelengths will differ. The electrical wavelength in the microstrip is much (on the order of 20–100 times) longer than the magnetostatic wavelength in the YIG film. The frequency of resonace is varied by varying the magnitude of the bias H field in order to change the phase velocity within the YIG film. Thus, the wavelength at resonance within the YIG film is held constant, but the wavelength outside of the cavity decreases with frequency, whereby the phase of $G_1$ varies in the manner discussed in the Summary of the Invention.

In this embodiment, the width W' of microstrip is not a sensitive parameter. However, the distance D between the nearest edges of the microstrip 53 and YIG film 54 has a strong effect on the coupling between the microstrip and the YIG film cavity. As discussed above, it is important for operation in an oscillator that there be overcoupling in the resonator. Therefore, the distance D is typically selected to be less than 100 microns and the YIG film is positioned to increase the effect of the magnetic field B produced by the microstrip currents on the dipoles in the YIG film. For this reason, in this side coupled embodiment, the YIG film is not placed directly to the side of the microstrip, but instead is placed in the recessed region on top of dielectric substrate 55. The dielectric material tends to concentrate the field lines downward so that a stronger B field from the transducer is induced in the YIG film.

Figure 6:
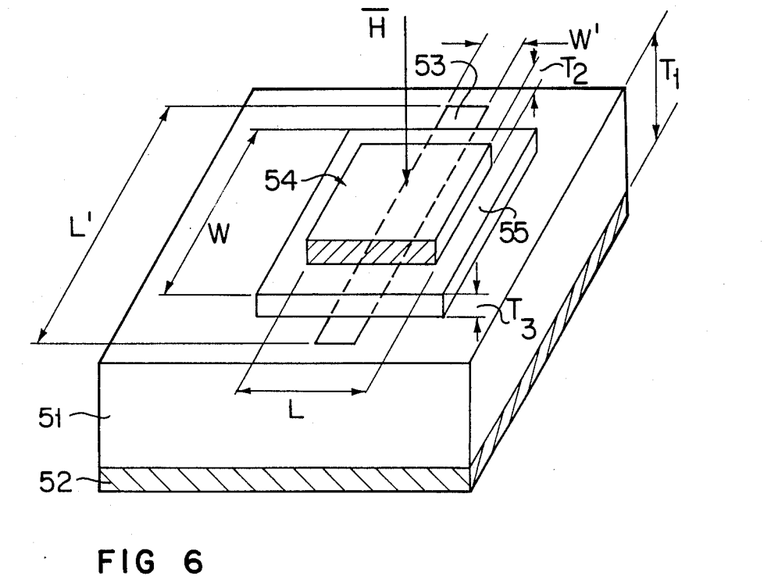
FIG. 6 illustrates a top coupled embodiment of the overcoupled resonator.

In FIG. 6 is presented a top coupled embodiment of the resonator. In this embodiment, YIG film 54 is located on top of microstrip 53. A low dielectric spacer 54 that is mounted on the microstrip and the YIG film is mounted on top of the spacer. This spacer thus determines the separation between the microstrip and the YIG film. This spacing is typically on the order of 50–150 microns. This embodiment presents a stronger coupling between the YIG film and the B fields created by the microstrip. This embodiment is therefore better for achieving an overcoupled resonator. The width W' is selected to be at least ½ the length L of YIG film 54 in order to suppress coupling to higher order modes between the side walls $s_3$ and $s_4$ of the cavity. The other dimensions of this device that are in common with the embodiment of FIG. 5 have the same general dimensions.

We claim:

1. A resonator comprising:
    a planar slab of magnetic material in which magnetostatic waves can be generated, said slab being oriented parallel to and located at a distance $d_m$ from a first side of a reference plane P;
    a transducer adjacent to said slab at a distance $d_t$ from said first side of reference plane P for coupling electromagnetic energy into magnetostatic waves in said slab;
    an electrical ground adjacent to said slab at a distance $d_g$ from said first side of reference plane P;
    these distances satisfying the relationship $d_g < d_m < d_t$ and being selected such that, as a function of $d_m$ alone, the flux of electric field at a given time through said slab from said transducer is greater than the case when $d_t = d_m$.

2. A resonator as in claim 1 wherein said slab has a thickness $t_m$ and wherein $d_m < d_t < (d_m + t_m)$, whereby said resonator is in a side coupled configuration.

3. A resonator as in claim 1 wherein said slab has a thickness $t_m$ and wherein $(d_m + t_m) < d_t$, whereby said resonator is in a top coupled embodiment.

4. A resonator as in claim 3 wherein there exists a straight line that passes through said slab, said transducer and said ground, whereby the slab is located between the transducer and the electrical ground.

5. A resonator as in claim 1 further comprising a dielectric substrate at a distance $d_d$ satisfying the relationship $d_g < d_d < d_m$ and positioned with respect to the slab, transducer and ground plane that the flux of electric field through the slab from the transducer is greater than when there is no dielectric substrate.

6. A resonator as in claim 5 wherein there exists a straight line that passes through said slab, said transducer and said ground, whereby the slab is located between the transducer and the electrical ground.

7. A resonator as in claim 1 wherein said slab has a pair of parallel straight ends and wherein said transducer is a linear microstrip conductor adjacent to and parallel to one of these ends.

8. A resonator as in claim 7 wherein said slab also has a pair of nonparallel sides, whereby the slab has a cross-section that is a quadrilateral with one pair of opposite parallel ends and one pair of opposite nonparallel sides, whereby the existence of nonparallel sides inhibits resonant modes between the nonparallel sides of the slab.

9. A resonator as in claim 7 wherein said linear conductor has a length L' less than one-fourth the electrical wavelength of a current signal frequency $f_2$ in said linear conductor.

10. A resonator as in claim 7 wherein said linear conductor is positioned at a distance D from the nearest end of said pair of parallel ends and wherein D is less than 100 microns.

11. Apparatus as in claim 7 wherein said transducer is coupled to a negative resistance device that exhibits to said resonator a reflection coefficient $S'_{11}$ that has an absolute magnitude that is greater than the absolute magnitude of $1/G_1$ over the range of frequencies from $f_1$ to $f_2$, whereby said apparatus will oscillate at a frequency between $f_1$ and $f_2$.

12. A resonator as in claim 1 wherein said transducer produces in said slab a magnetic field that couples to the magnetostatic waves in said slab strongly enough that said transducer exhibits a reflection coefficient that as a function of frequency, $G_1(f)$, when plotted on a Smith chart, encircles the origin of the Smith chart over a frequency range of interest contained within a resonance peak corresponding to a resonant response of the resonator at frequency $f_r$, whereby said resonator is overcoupled.

13. A resonator as in claim 12 wherein said plot of $G_1(f)$ on a Smith Chart, encircles the origin of the Smith Chart only once, said encirclement occurring as f passes through said resonance at $f_r$.

14. Apparatus as in claim 13 wherein said transducer is coupled to a negative resistance device that exhibits to said resonator a reflection coefficient $S'_{11}$ that has an absolute magnitude that is greater than the absolute magnitude of $1/G_1$ over the range of frequencies from $f_1$ to $f_2$, whereby said apparatus will oscillate at a frequency between $f_1$ and $f_2$.

15. A resonator as in claim 12 wherein said transducer is a linear microstrip conductor that is shorted at one end so that, except for a range of frequencies within the resonance peak at $f_r$, $G_1(f)$ lies in the inductive half of the Smith Chart.

16. Apparatus as in claim 15 wherein said transducer is coupled to a negative resistance device that exhibits to said resonator a reflection coefficient $S'_{11}$ that has an absolute magnitude that is greater than the absolute magnitude of $1/G_1$ over the range of frequencies from $f_1$ to $f_2$, whereby said apparatus will oscillate at a frequency between $f_1$ and $f_2$.

17. Apparatus as in claim 12 wherein said transducer is coupled to a negative resistance device that exhibits to said resonator a reflection coefficient $S'_{11}$ that has an absolute magnitude that is greater than the absolute magnitude of $1/G_1$ over the range of frequencies from $f_1$ to $f_2$, whereby said apparatus will oscillate at a frequency between $f_1$ and $f_2$.

18. Appratus as in claim 1 wherein said transducer is coupled to a negative resistance device that exhibits to said resonator a reflection coefficient $S'_{11}$ that has an absolute magnitude that is greater than the absolute magnitude of $1/G_1$ over the range of frequencies from $f_1$ to $f_2$, whereby said apparatus will oscillate at a frequency between $f_1$ and $f_2$.

* * * * *